(12) United States Patent
Morita

(10) Patent No.: US 8,563,409 B2
(45) Date of Patent: Oct. 22, 2013

(54) FILM-FORMING COMPOSITION

(75) Inventor: Toshiro Morita, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 107 days.

(21) Appl. No.: 13/175,341

(22) Filed: Jul. 1, 2011

(65) Prior Publication Data
US 2011/0263110 A1 Oct. 27, 2011

Related U.S. Application Data

(62) Division of application No. 12/307,848, filed as application No. PCT/JP2007/063251 on Jul. 2, 2007, now abandoned.

(30) Foreign Application Priority Data

Jul. 14, 2006 (JP) ................................. 2006-194921

(51) Int. Cl.
*H01L 21/22* (2006.01)
(52) U.S. Cl.
USPC ..................................... 438/562; 257/E21.15
(58) Field of Classification Search
USPC .................. 438/559, 560, 562; 257/E21.144, 257/E21.145, E21.15
See application file for complete search history.

(56) References Cited

U.S. PATENT DOCUMENTS

| 3,658,584 A | 4/1972 | Schmidt et al. |
|---|---|---|
| 4,793,862 A | 12/1988 | Ishikawa et al. |
| 6,695,903 B1 * | 2/2004 | Kubelbeck et al. ........... 438/559 |

FOREIGN PATENT DOCUMENTS

| CN | 1555086 A | 12/2004 |
|---|---|---|
| EP | 1 867 687 A1 | 12/2007 |
| JP | H05-326432 | 12/1993 |
| JP | H09-183948 | 7/1997 |
| JP | 2639591 B | 8/1997 |
| JP | 2002-043423 | 2/2002 |

OTHER PUBLICATIONS

Notice of Reasons for Rejection issued to CN Application No. 200780024402.3, mailed Dec. 25, 2009.
International Search Report for PCT/JP2007/063251 dated Sep. 18, 2007.
Supplementary European Search Report for EP 07768026.2, dated Jul. 8, 2010.

* cited by examiner

*Primary Examiner* — Chandra Chaudhari
(74) *Attorney, Agent, or Firm* — Hoffmann & Baron, LLP

(57) ABSTRACT

A film-forming composition for use in a coating diffusion method, capable of diffusing a dopant at a higher concentration, and further capable of concomitantly forming a silica-based coating film is provided. A film-forming composition for constituting a diffusion film provided for diffusing a dopant element into a silicon wafer, the film-forming composition including: (A) a polymeric silicon compound; (B) an oxide of the dopant element, or a salt including the dopant element; and (C) porogene.

7 Claims, No Drawings

FILM-FORMING COMPOSITION

CROSS-REFERENCE TO RELATED APPLICATIONS

This application is a divisional application of U.S. application Ser. No. 12/307,848, filed on Jan. 7, 2009, which is the National Stage of International Application No. PCT/JP2007/063251, filed Jul. 2, 2007, which claims the benefit of Japanese Application No. 2006-194921, filed Jul. 14, 2006, the contents of all of which are incorporated by reference in their entireties herein.

FIELD OF THE INVENTION

The present invention relates to a film-forming composition used in diffusion of a dopant employed when a dopant semiconductor is produced.

BACKGROUND OF THE INVENTION

Production techniques of semiconductors are indispensable techniques in producing electronic parts such as integrated circuits, and are playing a major role in electronic parts industry today. In semiconductor production process, a dopant is doped into an intrinsic semiconductor such as silicon or germanium, whereby dopant semiconductors such as P-type semiconductors having a positive hole, or N-type semiconductors having a free electron are produced. Although these dopant semiconductors do not conduct electric current in general, they can be readily changed so as to conduct electric current by applying a certain voltage since just a low amount of energy is required to excite the electron from the valence band to the conduction band.

The dopant element which may be used in doping into a silicon substrate is a 13 group element such as boron or gallium in the case of P-type semiconductors, or a 15 group element such as phosphorus, arsenic or antimony in the case of N-type semiconductors. As a method for diffusing a dopant, a variety of diffusion methods have been developed, and known methods include a gas diffusion method, a solid diffusion method, a coating diffusion method, and the like.

For example, Patent Document 1 discloses a method for diffusing a dopant by the solid diffusion method, and a dopant film used in the method.

In contrast, in the coating diffusion method, a coating solution containing a dopant is used to coat on a semiconductor substrate, and the solvent is volatilized to form a dopant diffusion source layer, followed by a thermal diffusion treatment to allow the dopant element to be diffused into the semiconductor substrate. This method is advantageous in that a dopant region can be formed by a comparatively simple manipulation without using an expensive apparatus.

Meanwhile, in forming an insulating film, flattening film or a protective film on a semiconductor substrate, a coating solution for forming a silica-based coating film has been used. This coating solution for forming a silica-based coating film contains a hydrolysate such as, for example, alkoxysilane, and thus a coating film including silicon dioxide as a principal component can be formed by coating the solution on a semiconductor substrate, and then heating (for example, see, Patent Document 2).

Patent Document 1: Japanese Patent No. 2639591
Patent Document 2: Japanese Patent Application Laid-open No. H9-183948 A

SUMMARY OF THE INVENTION

However, since the dopant film described in Patent Document 1 does not contain silicon, an object such as prevention of contamination of other contaminant by forming a silica-based coating film concomitantly with diffusion of the dopant, cannot be achieved. In addition, since the diffusion of the dopant using a dopant film described in Patent Document 1 is carried out by a solid diffusion method, an expensive apparatus is required, leading to disadvantages in that it is not suited for large-scale production. Moreover, even though boron oxide or the like is further included in the coating solution for forming a silica-based coating film described in Patent Document 2, sufficient diffusion of the dopant cannot be effected. Thus, the intended value of resistance cannot be exhibited.

The present invention was made in view of the foregoing problems, and an object of the invention is to provide a film-forming composition for use in a coating diffusion method, capable of diffusing a dopant at a higher concentration, and further capable of concomitantly forming a silica-based coating film.

The present inventors found that by using a film composition that contains a polymeric silicon compound, an oxide of a dopant element or a salt including the dopant element, and porogene, the dopant can be diffused into a silicon wafer at a high concentration, and can concomitantly form a silica-based coating film. Accordingly, the present invention has been completed.

Specifically, the present invention provides the following.

A first aspect of the present invention provides a film-forming composition for constituting a diffusion film provided for diffusing a dopant element into a silicon wafer, the film-forming composition including: (A) a polymeric silicon compound; (B) an oxide of the dopant element, or a salt including the dopant element; and (C) porogene.

In addition, the film-forming composition of the present invention is a film-forming composition for constituting a diffusion film provided for diffusing a dopant element into a silicon wafer, the film-forming composition including: (A) a polymeric silicon compound; (B) an oxide of the dopant element, or a salt including the dopant element; and (C) porogene.

The film-forming composition of the present invention may also contain as a component (E) in place of the component (C), a reducing agent that reduces the component (B).

The film-forming composition of the present invention can be used in a coating diffusion method, is capable of diffusing a dopant element at a higher concentration into a silicon wafer, and further capable of forming a silica-based coating film, which can serve as a protective film, concomitantly with the diffusion of the dopant. Consequently, more efficient diffusion of the dopant element is enabled while suppressing contamination of a contaminant during diffusing a dopant.

DETAILED DESCRIPTION OF THE INVENTION

Hereinafter, modes for carrying out the present invention will be explained in detail.

Film-forming Composition

The film-forming composition according to this embodiment is a film-forming composition containing: (A) a polymeric silicon compound; (B) an oxide of a dopant element, or a salt including the dopant element; (C) porogene; and (D) a solvent capable of dissolving the polymeric silicon compound.

(A) Polymeric Silicon Compound

The polymeric silicon compound included in the film-forming composition according to this embodiment is not particularly limited, and may be for example, one or more selected from the group consisting of a siloxane polymer compound having a Si—O bond in a main chain, a silicon carbide polymer compound having a Si—C bond in a main chain, a polysilane polymer compound having a Si—Si bond in a main chain, and a silazane polymer compound having a Si—N bond in a main chain. Moreover, any mixture of these compounds can be used. Also, a siloxane polymer compound is particularly preferably used among these.

Siloxane Polymer Compound

It is preferable that the siloxane polymer compound as the polymeric silicon compound in the film-forming composition according to this embodiment be a hydrolysis condensation polymerization product prepared using at least one kind of alkoxysilanes represented by the following formula (F) as a starting material.

$$R^1{}_n\text{—Si}(OR^2)_{4-n} \quad (F)$$

wherein, $R^1$ represents a hydrogen atom or a monovalent organic group; $R^2$ represents a monovalent organic group; and n is an integer of 1 to 3.

Here, as the monovalent organic groups, for example, an alkyl group, an aryl group, an allyl group, and a glycidyl group may be exemplified. Among these, preferred are an alkyl group and an aryl group. Especially preferred is the alkyl group having 1 to 5 carbon atoms, such as e.g., a methyl group, an ethyl group, a propyl group and a butyl group. Also, the alkyl group may be linear or branched, and may include substitution of a hydrogen atom with a fluorine atom. As the aryl group, preferred are those having 6 to 20 carbon atoms, such as e.g., a phenyl group and a naphthyl group.

Specific examples of the compound represented by the formula (F) include the following:

(i) in the case of n=1, monoalkyltrialkoxysilane such as monomethyltrimethoxysilane, monomethyltriethoxysilane, monomethyltripropoxysilane, monoethyltrimethoxysilane, monoethyltriethoxysilane, monoethyltripropoxysilane, monopropyltrimethoxysilane and monopropyltriethoxysilane, and monophenyltrialkoxysilane such as monophenyltrioxysilane and monophenyltriethoxysilane;

(ii) in the case of n=2, dialkyldialkoxysilane such as dimethyldimethoxysilane, dimethyldiethoxysilane, dimethyldipropoxysilane, diethyldimethoxysilane, diethyldiethoxysilane, diethyldipropoxysilane, dipropyldimethoxysilane and dipropyldiethoxysilane, and diphenyldialkoxysilane such as diphenyldimethoxysilane and diphenyldiethoxysilane; and (iii) in the case of n=3, trialkylalkoxysilane such as trimethylmethoxysilane, trimethylethoxysilane, trimethylpropoxysilane, triethylmethoxysilane, triethylethoxysilane, triethylpropoxysilane, tripropylmethoxysilane and tripropylethoxysilane, and triphenylalkoxysilane such as triphenylmethoxysilane and triphenylethoxysilane, and the like.

Among them, monomethyltrialkoxysilane such as monomethyltrimethoxysilane, monomethyltriethoxysilane and monomethyltripropoxysilane may preferably be used.

In the film-forming composition according to this embodiment, the mass-average molecular weight of the siloxane polymer compound may be preferably no less than 200 and no greater than 50,000, and more preferably no less than 1,000 and no greater than 3,000. By adjusting the mass-average molecular weight to fall within the range described above, the coating properties and film-forming ability can be improved. In addition, the siloxane polymer compound is preferably included in an amount of 1 to 60% by mass, and preferably 10 to 30% by mass based on the mass of the entire film-forming composition.

Condensation of the alkoxysilane represented by the formula (F) is carried out by hydrolyzing alkoxysilane in an organic solvent to which an acid catalyst is added, and allowing the resulting hydrolysate to be condensed and polymerized. With respect to the alkoxysilane added to the reaction system, it may be used alone or in combination of two or more.

The hydrolysis and condensation polymerization of the alkoxysilane can be carried out by, for example, adding an aqueous solution containing an acid catalyst dropwise to an organic solvent containing one or more of the alkoxysilane represented by the formula (F), and allowing to react.

Although the degree of hydrolysis of alkoxysilane can be adjusted by the quantity of water added, in general, the number of moles of water added is 1.0 to 10.0 times the number of moles of alkoxysilane represented by the above formula (F). When the quantity of water added in moles is no less than 1.0 times the number of moles of alkoxysilane, it is possible to sufficiently increase the degree of hydrolysis, thereby facilitating the coating film formation. In contrast, when the quantity of water added in moles is no greater than 10.0 times the number of moles of alkoxysilane, it is possible to prevent gelation by suppressing production of the polymer having branches through condensation polymerization, whereby stability of the film-forming composition can be improved.

Moreover, the acid catalyst added in carrying out the hydrolysis reaction and the condensation polymerization reaction of the alkoxysilane represented by the formula (F) is not particularly limited, but any of conventionally used organic acid and inorganic acid can be used. Examples of the organic acid include carboxylic acids such as acetic acid, propionic acid and butyric acid, and examples of the inorganic acid include hydrochloric acid, nitric acid, sulfuric acid, phosphoric acid, and the like. The acid catalyst may be directly added to an organic solvent in which alkoxysilane was dissolved, or may be added in the form of an acidic aqueous solution after dissolving in water to be used in hydrolysis of alkoxysilane.

Since the polymeric silicon compound is included in the film-forming composition as described above, silicon dioxide is produced in the thermal diffusion treatment, and thus a silica-based coating film can be formed. This silica-based coating film serves as a protective film, whereby contamination of a contaminant other than the dopant element to which the diffusion is intended can be prevented.

(B) Dopant Element

Examples of the dopant element added to the film-forming composition according to this embodiment include 13 group elements such as boron, gallium etc., 15 group elements such as phosphorus, arsenic, antimony etc., and other elements such as zinc and copper, and the like. Also, the dopant element can be added in the form of the oxide, halide, the inorganic salt such as nitrate, sulfate etc., or the salt of organic acid such as acetic acid to the film-forming composition. Specifically, phosphorus compounds such as $P_2O_5$, $NH_4 \cdot H_2PO_4$, $(RO)_3P$, $(RO)_2P(OH)$, $(RO)_3PO$, $(RO)_2P_2O_5(OH)_3$, and $(RO)P(OH)_2$, boron compounds such as $B_2O_3$, $(RO)_3B$, $RB(OH)_2$, and $R_2B(OH)$, antimony compounds such as $H_3SbO_4$, $(RO)_3Sb$, $SbX_3$, $SbOX$, and $Sb_4O_5X$, arsenic compounds such as $H_3AsO_3$, $H_2AsO_4$, $(RO)_3As$, $(RO)_5As$, $(RO)_2As(OH)$, $R_3AsO$, and $RAs=AsR$, zinc compounds such as $Zn(OR)_2$, $ZnX_2$, and $Zn(No_2)_2$, gallium compounds such as $(RO)_3Ga$, $RGa(OH)$, $RGa(OH)_2$, and $R_2Ga[OC(CH_3)=CH—CO—(CH_3)]$, and the like (wherein, R represents a halogen atom, an alkyl group, an alkenyl group or an aryl group, and X represents a halogen atom) are included.

Among these compounds, boron oxide, phosphorus oxide and the like can be preferably used.

Accordingly, since the film-forming composition contains an oxide of a dopant element or a salt including the dopant element, the dopant can be diffused into a silicon wafer by coating the film composition on a silicon wafer, and subjecting to a thermal diffusion treatment.

It is preferred that the mass ratio of the siloxane polymer compound (A) to the oxide of a dopant element or a salt including the dopant element (B) falls within the range of 1:0.01 to 1:1. By including the component (A) to fall within the above range, the dopant can be diffused at a high concentration, and also, formation of a uniform coating film is facilitated.

(C) Porogene

According to the present invention, porogene means a material which is decomposed during baking of the coating film formed from the film-forming composition, and forms pores on the silica-based coating film finally formed. As the porogene, for example, polyalkylene glycol or an end-alkylated product thereof; a monosaccharide such as glucose, fructose or galactose, or a derivative thereof; a disaccharide such as sucrose, maltose or lactose, or a derivative thereof; or a polysaccharide, or a derivative thereof can be included. Among these organic compounds, polyalkylene glycol is preferred, and polypropylene glycol is more preferred. The porogene has a mass-average molecular weight of preferably no less than 300 and no greater than 10,000, and more preferably no less than 500 and no greater than 5,000. The mass-average molecular weight being no less than 300 leads to inhibition of decomposition and volatilization when the film-forming composition is coated and dried, and thus porogene can act satisfactorily during the thermal diffusion treatment. In contrast, the mass-average molecular weight being no greater than 10,000 leads to ease in decomposition during the thermal diffusion treatment, whereby porogene can act satisfactorily.

The content of porogene in the film-forming composition is preferably 2% by mass to 20% by mass, and more preferably 3% by mass to 10% by mass based on the mass of the entire film-forming composition.

By including porogene as described above, a porous silica-based coating film can be formed from the film-forming composition coated on the silicon wafer. By providing a porous silica-based coating film, migration rate of the dopant element in the silica-based coating film is improved, and thus diffusion of the dopant element into the silicon wafer is believed to be accelerated. In addition, since the silica-based coating film formed as described above can be porous, the following time period for etching can be reduced. Moreover, by including the porogene as described above, the effect of preventing the dopant element, which is derived from the outside of the film formed from the film-forming composition, from diffusing into the silicon wafer can be improved.

In addition, it is preferred that the porogene serves as a reducing agent for reducing the dopant element. In other words, the film-forming composition according to this embodiment constitutes a diffusion film for diffusing a dopant element into a silicon wafer, the film-forming composition including: (A) a polymeric silicon compound; (B) an oxide of the dopant element, or a salt containing the dopant element; and (E) a reducing agent that reduces the component (B).

Specific examples of the porogene that serves as a reducing agent include polyalkylene glycols such as polyethylene glycol and polypropylene glycol, and end-alkylated products thereof; monosaccharides such as glucose, fructose and galactose, and derivatives thereof; disaccharides such as sucrose, maltose and lactose, and derivatives thereof; and polysaccharides, and derivatives thereof, and the like. Among these organic compounds, polyalkylene glycol is preferred, and polypropylene glycol is more preferred.

It is preferred that the reducing agent does not leave its oxide in the silica-based coating film after the thermal diffusion treatment. By using such a compound, adverse influences on semiconductor characteristics can be eliminated.

The quantity of porogene can be determined appropriately depending on the quantity of the oxide of the dopant element added to the film-forming composition, and the content of the polymeric silicon compound. The content of the reducing agent in the film-forming composition is preferably 2% by mass to 20% by mass, and more preferably 3% by mass to 10% by mass based on the mass of the entire film-forming composition.

As described in the foregoing, by including the reducing agent for use in reducing the dopant element, the oxide of the dopant element or a salt containing the dopant element is reduced to give the dopant element, whereby diffusion to the silicon wafer can be facilitated. Thus, a dopant semiconductor having a desired resistance value can be readily obtained.

(D) Solvent

From the perspective of achieving improved film thickness and coating homogeneity of the components, and coating properties, it is preferable that the film-forming composition according to this embodiment contains a solvent. In such a case, any organic solvent which has been conventionally used can be employed as the solvent. Specific examples of the solvent include monovalent alcohols such as methanol, ethanol, propanol, butanol, 3-methoxy-3-methyl-1-butanol, and 3-methoxy-1-butanol; alkylcarboxylic acid esters such as methyl-3-methoxypropionate, and ethyl-3-ethoxypropionate; polyhydric alcohols such as ethylene glycol, diethylene glycol, and propylene glycol; polyhydric alcohol derivatives such as ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, ethylene glycol monomethyl ether acetate, ethylene glycol monoethyl ether acetate, and propylene glycol monomethyl ether acetate; fatty acids such as acetic acid, and propionic acid; ketone such as acetone, methyl ethyl ketone, and 2-heptanone. These organic solvents may be used alone, or in combination.

The quantity of the solvent is not particularly limited, but it is preferably used to give a solid content of 1 to 100% by mass, and in light of improved coating properties, it is more preferably used to give a solid content of 3 to 20% by mass.

Other Additives

Surfactant

A surfactant can be included in the film-forming composition according to this embodiment as needed. It is possible to improve coating properties on the silicon wafer, smoothness and spreading properties by adding the surfactant. These may be used alone, or in combination.

Other Components

It is possible to include other resins, additives and the like in the film-forming composition according to this embodiment within the range not to impair the effects of the invention. These resins, and additives can be selected appropriately and added, depending on the intended use of the film-forming composition.

Coating Film Formation, Thermal Diffusion Treatment, Etching

The film-forming composition according to this embodiment is coated on a silicon wafer to form a film, and thereafter subjected to a thermal diffusion treatment, thereby executing formation of a silica-based coating film, and dopant diffusion. When the dopant diffusion is allowed only on a certain region, formation of a protective film, patterning and the like are carried out prior to coating of the film-forming composition.

Coating Film Formation

The coating of the film-forming composition can be carried out with an appropriate method which is usually carried out by persons skilled in the art. Specific examples of the method for coating include a spraying method, a roll coating method, a spin-coating method, and the like. The coating quantity of the film-forming composition can be predetermined appropriately depending on the solid content.

After the film-forming composition was coated on a silicon wafer, it is preferred that the film-forming composition coated on the silicon wafer be subjected to a heating treatment. Accordingly, a coating film can be formed on the silicon wafer.

Thermal Diffusion Treatment

A thermal diffusion treatment is carried out for diffusing into the silicon wafer the dopant element from the coating film formed on the silicon wafer, and further forming a silica-based coating film. The thermal diffusion treatment is carried out at, for example, from 600° C. to 1200° C. The silica-based coating film formed in the thermal diffusion treatment can serve as a protective film for preventing diffusion of other contaminant into the silicon wafer during the thermal diffusion treatment. Thus, accuracy of the resistance value of the formed dopant semiconductor can be kept at a high level.

Etching

The silica-based coating film after the thermal diffusion treatment is removed by etching. For the etching, hydrofluoric acid, a mixture of hydrofluoric acid and nitric acid, an aqueous solution of sodium hydroxide or potassium hydroxide, or the like may be used. In this process, the protective film formed on the under layer of the silica-based coating film for the pattern formation can be concomitantly removed.

EXAMPLES

Example 1

Using "OCD T-1 B type" (manufactured by Tokyo Ohka Kogyo Co., Ltd.), a film-forming composition was prepared by adding boron oxide to give a concentration of 1.5 g/100 ml, and polypropylene glycol having a mass-average molecular weight of 2,000 to give a concentration of 5%, based on the total quantity.

The film-forming composition was spin-coated on a silicon wafer "6 inch CZ-N <100>" (manufactured by Mitsubishi Materials Corporation). Heating treatment at 80° C., 150° C., and 200° C. each for 60 sec was carried out to form a film.

The silicon wafer on which the film was formed was subjected to a thermal diffusion treatment by baking under a nitrogen environment in a baking furnace at 1,000° C. for 15 min, 30 min, and 45 min.

The silicon wafer after the thermal diffusion treatment was immersed in 5% hydrofluoric acid at room temperature for 10 min to remove the film from the silicon wafer by etching.

Example 2

A film-forming composition was prepared in a similar manner to Example 1 except that 10% polypropylene glycol having a mass-average molecular weight of 2,000 was added, and then coating film formation, the thermal diffusion treatment and etching were carried out.

Example 3

A film-forming composition was prepared in a similar manner to Example 1 except that 3% polypropylene glycol having a mass-average molecular weight of 2,000 was added, and then coating film formation, the thermal diffusion treatment and etching were carried out.

Example 4

A film-forming composition was prepared in a similar manner to Example 1 except that 6% polypropylene glycol having a mass-average molecular weight of 2,000 was added, and then coating film formation, the thermal diffusion treatment and etching were carried out. The thermal diffusion treatment was carried out for a time period of 30 min.

Example 5

A film-forming composition was prepared in a similar manner to Example 1 except that 7% polypropylene glycol having a mass-average molecular weight of 2,000 was added, and then coating film formation, the thermal diffusion treatment and etching were carried out. The thermal diffusion treatment was carried out for a time period of 30 min.

Example 6

A film-forming composition was prepared in a similar manner to Example 1 except that 5% polypropylene glycol having a mass-average molecular weight of 400 was added, and then coating film formation, the thermal diffusion treatment and etching were carried out. The thermal diffusion treatment was carried out for a time period of 15 min.

Example 7

Using "OCD T-1" (manufactured by Tokyo Ohka Kogyo Co., Ltd.), a film-forming composition was prepared by adding $P_2O_5$ to give a concentration of 1.5 g/100 ml, and polypropylene glycol having a mass-average molecular weight of 4,000 to give a concentration of 6%, based on the total quantity.

This film-forming composition was used in the coating film formation in a similar manner to Example 1, and subjected to the thermal diffusion treatment at 900° C. The thermal diffusion treatment was carried out for a time period of 30 min.

Comparative Example 1

A film-forming composition was prepared in a similar manner to Example 1 except that polypropylene glycol having a mass-average molecular weight of 2,000 was not added, and then coating film formation, the thermal diffusion treatment and etching were carried out.

Comparative Example 2

A film-forming composition was prepared in a similar manner to Example 7 except that polypropylene glycol having a mass-average molecular weight of 4,000 was not added, and then coating film formation, the thermal diffusion treatment and etching were carried out.

Determination of Resistance Value

With respect to the silicon wafer after the etching in the Examples and Comparative Examples described above, the resistance value was determined. Variation of the resistance value depending on the difference in the content of polypropylene glycol, and the time period of the thermal diffusion treatment is shown in Table 1 below.

TABLE 1

| Diffusion time | resistance value(Ω/□) | | |
|---|---|---|---|
| | 15 min | 30 min | 45 min |
| Example 1 | 115.1 | 110.8 | 94.1 |
| Example 2 | 379.7 | 250.2 | 211.2 |
| Example 3 | 474.3 | 287.7 | 237.3 |
| Example 4 | — | 103.4 | — |
| Example 5 | — | — | 87.0 |
| Example 6 | 187.8 | — | — |
| Example 7 | — | 187.7 | — |
| Comparative Example 1 | 657.7 | 357.4 | 365.1 |
| Comparative Example 2 | — | 180.9 | — |

From Example 1, Example 2, and Comparative Example 1, it was found that a lower resistance value was exhibited by the silicon wafer of Example 1 as compared with that of Comparative Example 1. More specifically, it was proven that boron oxide was reduced by adding polypropylene glycol, whereby efficient diffusion into the silicon wafer was permitted. In contrast, Example 2 demonstrated a lower degree of reduction in the resistance value as compared with the case of Example 1.

From Example 1, Example 3, and Comparative Example 1, it was found that a lower resistance value was exhibited by the silicon wafer of Example 3 as compared with that of Comparative Example 1, and that further lower resistance value was exhibited in Example 1.

Also, it was revealed from Example 1, and Example 4 to Example 6 that polypropylene glycol having a mass-average molecular weight of 2,000 lead to a lower value of resistance as the content thereof increased. In addition, when compared at a content of 5% with respect to polypropylene glycol having a mass-average molecular weight of 2,000 and polypropylene glycol having a mass-average molecular weight of 400, it was revealed that a lower resistance value was exhibited when polypropylene glycol having a mass-average molecular weight of 2,000 was used (i.e., in use, a polypropylene glycol having a higher molecular weight is preferred).

Furthermore, it was proven from Example 7 and Comparative Example 2 that a resistance value equivalent to that when polypropylene glycol was not added was exhibited, in the case in which polypropylene glycol was added even though the dopant was added in an amount of one twentieth.

What is claimed is:

1. A method for diffusing a dopant element into a silicon wafer, comprising
   forming a coating film on the silicon wafer by coating on a silicon wafer a film-forming composition comprising (A) a polymeric silicon compound, (B) an oxide of the dopant element, or a salt including the dopant element, and (C) a porogene comprising a polyalkylene glycol which is 3 to 10% by mass with respect to the film-forming composition, and
   carrying out a thermal diffusion treatment, and diffusing the dopant element from the coating film into the silicon wafer.

2. The method for diffusing a dopant element into a silicon wafer according to claim 1, wherein the film-forming composition further comprises (D) a solvent that can dissolve the polymeric silicon compound, and wherein the component (C) is a high molecular weight organic compound which can be dissolved in the solvent.

3. The method for diffusing a dopant element into a silicon wafer according to claim 1, wherein the component C is polypropylene glycol.

4. The method for diffusing a dopant element into a silicon wafer according to claim 1, wherein the component C has a mass-average molecular weight of no less than 500.

5. The method for diffusing a dopant element into a silicon wafer according to claim 1, wherein the dopant element is a 13 group element or a 15 group element.

6. The method for diffusing a dopant element into a silicon wafer according to claim 1, wherein the dopant element is boron or phosphorus.

7. The method for diffusing a dopant element into a silicon wafer according to claim 1, wherein the thermal diffusion treatment is carried out at a temperature of 600 to 1200° C.

* * * * *